US011353794B2

(12) United States Patent
Peters et al.

(10) Patent No.: US 11,353,794 B2
(45) Date of Patent: Jun. 7, 2022

(54) PHOTORESIST STRIPPER

(71) Applicant: Versum Materials US, LLC, Tempe, AZ (US)

(72) Inventors: Richard Dalton Peters, Tempe, AZ (US); Michael T. Phenis, Tempe, AZ (US)

(73) Assignee: VERSUM MATERIALS US, LLC, Tempe, AZ (US)

(*) Notice: Subject to any disclaimer, the term of this patent is extended or adjusted under 35 U.S.C. 154(b) by 211 days.

(21) Appl. No.: 16/222,248

(22) Filed: Dec. 17, 2018

(65) Prior Publication Data
US 2019/0196337 A1 Jun. 27, 2019

Related U.S. Application Data

(60) Provisional application No. 62/609,561, filed on Dec. 22, 2017.

(51) Int. Cl.
*G03F 7/42* (2006.01)
*C11D 11/00* (2006.01)
*C11D 3/43* (2006.01)
*C11D 3/00* (2006.01)
*C11D 1/00* (2006.01)
*C11D 3/20* (2006.01)
*C11D 3/04* (2006.01)
*C11D 3/30* (2006.01)
*C11D 3/34* (2006.01)
*B32B 3/06* (2006.01)
*E04F 15/02* (2006.01)

(52) U.S. Cl.
CPC .............. *G03F 7/426* (2013.01); *B32B 3/06* (2013.01); *C11D 1/004* (2013.01); *C11D 3/0073* (2013.01); *C11D 3/048* (2013.01); *C11D 3/2058* (2013.01); *C11D 3/2065* (2013.01); *C11D 3/30* (2013.01); *C11D 3/3445* (2013.01); *C11D 3/43* (2013.01); *C11D 11/0047* (2013.01); *E04F 15/02022* (2013.01); *E04F 15/02038* (2013.01); *G03F 7/425* (2013.01); *B32B 2307/7265* (2013.01); *B32B 2419/04* (2013.01); *E04F 2201/023* (2013.01); *E04F 2201/044* (2013.01); *E04F 2201/06* (2013.01); *E04F 2201/08* (2013.01)

(58) Field of Classification Search
CPC ............... G03F 7/426; C11D 11/0047
See application file for complete search history.

(56) References Cited

U.S. PATENT DOCUMENTS

| 4,018,703 | A | * | 4/1977 | Turner | C23F 11/04 252/394 |
|---|---|---|---|---|---|
| 7,632,796 | B2 | | 12/2009 | Phenis et al. | |
| 7,671,001 | B2 | * | 3/2010 | Skee | C23G 1/16 510/175 |
| 8,158,568 | B2 | * | 4/2012 | Yokoi | C11D 7/32 510/175 |
| 2003/0130146 | A1 | * | 7/2003 | Egbe | C23G 5/02 134/28 |
| 2004/0038840 | A1 | * | 2/2004 | Lee | C11D 7/265 510/202 |
| 2004/0121937 | A1 | * | 6/2004 | Yokoi | C11D 11/0047 510/504 |
| 2004/0220065 | A1 | * | 11/2004 | Hsu | C11D 3/28 510/175 |
| 2004/0256358 | A1 | | 12/2004 | Shimizu et al. | |
| 2004/0259761 | A1 | | 12/2004 | Yokoi et al. | |
| 2005/0176603 | A1 | * | 8/2005 | Hsu | G03F 7/425 134/42 |
| 2006/0094613 | A1 | * | 5/2006 | Lee | C11D 11/0047 257/E21.255 |
| 2006/0241012 | A1 | * | 10/2006 | Yokoi | C11D 11/0047 510/504 |
| 2007/0075291 | A1 | * | 4/2007 | Paik | C09G 1/02 252/79.1 |
| 2007/0099805 | A1 | | 5/2007 | Phenis et al. | |
| 2009/0032144 | A1 | * | 2/2009 | McMillen | C23C 22/34 148/247 |
| 2009/0036344 | A1 | * | 2/2009 | Pollard | G03F 7/426 510/176 |

(Continued)

FOREIGN PATENT DOCUMENTS

CN 101750914 6/2010
JP 2001022096 1/2001

(Continued)

OTHER PUBLICATIONS

Lin, Chun-Chi, et al., "Tetramethylammonium hydroxide poisoning," Clinical Toxicology, 2010, 48, pp. 213-217.

(Continued)

*Primary Examiner* — Nicole M. Buie-Hatcher
*Assistant Examiner* — M. Reza Asdjodi
(74) *Attorney, Agent, or Firm* — William T. Slaven, IV

(57) ABSTRACT

Improved stripper solutions for removing photoresists from substrates are provided that typically have freezing points below about 0° C. and high loading capacities. The stripper solutions comprise dimethyl sulfoxide, quaternary ammonium hydroxide, and an alkanolamine having at least two carbon atoms, at least one amino substituent and at least one hydroxyl substituent, the amino and hydroxyl substituents attached to two different carbon atoms. Some formulations can additionally contain a secondary solvent. The formulations do not contain tetramethylammonium hydroxide. Methods for use of the stripping solutions are additionally provided.

16 Claims, No Drawings

(56) References Cited

U.S. PATENT DOCUMENTS

| | | | |
|---|---|---|---|
| 2009/0156005 A1* | 6/2009 | Yokoi | H01L 21/31138 438/689 |
| 2010/0051582 A1* | 3/2010 | Yokoi | C11D 11/0047 216/41 |
| 2010/0248477 A1* | 9/2010 | Yokoi | H01L 21/31138 438/689 |
| 2013/0161840 A1 | 6/2013 | Pollard et al. | |
| 2013/0334679 A1 | 12/2013 | Atkinson et al. | |
| 2014/0137894 A1* | 5/2014 | Peters | G03F 7/428 134/19 |
| 2014/0137899 A1* | 5/2014 | Peters | B08B 3/10 134/26 |
| 2014/0138353 A1* | 5/2014 | Peters | B08B 3/02 216/41 |
| 2014/0141622 A1* | 5/2014 | Peters | H01L 21/32134 438/754 |
| 2014/0142017 A1* | 5/2014 | Peters | C11D 7/3263 510/176 |
| 2014/0155310 A1* | 6/2014 | Phenis | C11D 7/3218 510/176 |
| 2015/0094249 A1* | 4/2015 | Peters | G03F 7/423 510/176 |
| 2017/0037344 A1 | 2/2017 | Chang et al. | |
| 2019/0196337 A1* | 6/2019 | Peters | C11D 11/0047 |
| 2019/0278184 A1* | 9/2019 | Cao | H01L 21/31133 |

FOREIGN PATENT DOCUMENTS

| | | |
|---|---|---|
| JP | 2010536065 | 11/2010 |
| WO | 2009020799 | 2/2009 |

OTHER PUBLICATIONS

Wu, Chen-Long, et al., "Mortality from Dermal Exposure to Tetramethylammonium Hydroxide," Journal of Occupational Health, 2008, 50, pp. 99-102.

Park, Seung-Hyun, et al., "Tetramethylammonium Hydroxide Poisoning during a Pallet Cleaning Demonstration," Journal of Occupational Health, 2013, 55, pp. 120-124.

* cited by examiner

PHOTORESIST STRIPPER

This invention claims priority to U.S. Ser. No. 62/609,562, filed Dec. 22, 2017, having the same title, which is fully incorporated herein by reference.

BACKGROUND OF THE INVENTION

The present invention relates generally to compositions having the ability to effectively remove photoresists from substrates, and to methods for using such compositions.

There are many stripper solutions for the removal of photoresists, such as those disclosed in U.S. Pat. No. 7,632,796. Improved stripper solution compositions are required by wafer manufacturers' increasing demands for improved performance. Strippers need to remain liquid at temperatures below normal room temperature and temperatures frequently encountered in transit and warehousing. Additionally, stripper formulations need to have advantageous loading capacities for the photoresist materials that are removed. Additionally, little or low metal removal (etching) and long stability are desired.

BRIEF DESCRIPTION OF THE INVENTION

In one aspect of the present invention there are provided photoresist stripper solutions for effectively removing or stripping a photoresist from a substrate. The inventive stripper solutions have particularly high loading capacities for the resist material, and the ability to remain a liquid when subjected to temperatures below normal room temperature that are typically encountered in transit, warehousing and in use in some manufacturing facilities. The compositions have freezing points sufficiently below 15° C. to minimize solidification during transportation and warehousing. More preferred formulations have freezing points below about 0° C.

The compositions according to the present disclosure typically contain dimethyl sulfoxide (DMSO), a quaternary ammonium hydroxide, and an alkanolamine. One preferred embodiment contains from about 20% to about 90% dimethyl sulfoxide, from about 1% to about 7% of a quaternary ammonium hydroxide, and from about 1% to about 75% of an alkanolamine having at least two carbon atoms, at least one amino substituent and at least one hydroxyl substituent, the amino and hydroxyl substituents attached to two different carbon atoms. The preferred quaternary groups are ($C_1$-$C_8$) alkyl, benzyl, arylalkyl, ($C_1$-$C_5$) alcohol, and combinations thereof. Particularly preferred quaternary ammonium hydroxides contain at least 5 carbons, and/or may include at least one alkanol group. Quaternary ammonium hydroxides having at least one alkanol group (e.g. ($C_1$-$C_5$) alcohol group) include choline hydroxide and tri(2-hydroxyethyl)methylammonium hydroxide. Quaternary ammonium hydroxides may include choline hydroxide, tri(2-hydroxyethyl)methylammonium hydroxide and dimethyldipropylammonium hydroxide. Quaternary ammonium hydroxides may include choline hydroxide and dimethyldipropylammonium hydroxide. The quaternary ammonium hydroxides do not include tetramethylammonium hydroxide (TMAH). The resulting compositions additionally exhibit reduced human central nervous system toxicity in comparison to compositions including tetramethylammonium hydroxide (TMAH). Particularly preferred 1,2-alkanolamines include compounds of the formula:

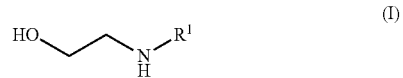

where $R^1$ can be H, $C_1$-$C_4$ alkyl, or $C_1$-$C_4$ alkylamino. For particularly preferred alkanol amines of formula I, $R^1$ is H or $CH_2CH_2NH_2$. A further embodiment according to this present disclosure contains an additional or secondary solvent. Preferred secondary solvents include glycols, polyhydroxyl compounds, and the like. A further embodiment, according to this present disclosure, additionally contains corrosion inhibitors.

A second aspect of the present disclosure provides for methods of using the novel stripper solutions described above to remove photoresist and related polymeric materials from a substrate. A photoresist can be removed from a selected substrate having a photoresist thereon by contacting the substrate with a stripping solution for a time sufficient to remove the desired amount of photoresist, by removing the substrate from the stripping solution, rinsing the stripping solution from the substrate with a solvent and drying the substrate.

A third aspect of the present disclosure includes electronic devices manufactured by the novel method disclosed.

Other features and advantages of the present invention will be apparent from the following more detailed description, taken in conjunction with the example solutions which illustrate the principles of the invention.

DETAILED DESCRIPTION OF THE INVENTION

For the purposes of promoting an understanding of what is claimed, references will now be made to the embodiments illustrated and specific language will be used to describe the same. It will nevertheless be understood that no limitation of the scope of what is claimed is thereby intended, such alterations and further modifications and such further applications of the principles thereof as illustrated therein being contemplated as would normally occur to one skilled in the art to which the disclosure relates.

The compositions according to this present disclosure include dimethyl sulfoxide (DMSO), a quaternary ammonium hydroxide, and an alkanolamine having at least two carbon atoms, at least one amino substituent and at least one hydroxyl substituent, the amino and hydroxyl substituents attached to two different carbon atoms. Preferred quaternary substituents include ($C_1$-$C_8$) alkyl, benzyl and combinations thereof. Preferred compositions have freezing points sufficiently below 25° C. to minimize solidification during transportation and warehousing. More preferred formulations have freezing points below about 15° C., below about 0° C., below about –5° C., below about –7° C., below about –10° C., below about –12° C., below about –15° C., below about –18° C., and/or below about –21° C. and a loading capacity of from about 15 cm$^3$/liter up to about 90 cm$^3$/liter. Formulations having increased levels of an alkanolamine have the advantage of being particularly noncorrosive to carbon steel and are less injurious to typical waste treatments systems and auxiliary equipment than other stripper solutions. Particularly preferred compositions contain 1,2-alkanolamines having the formula:

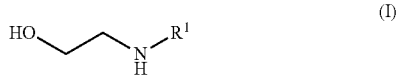
(I)

where R[1] is hydrogen, ($C_1$-$C_4$) alkyl, or ($C_1$-$C_4$) alkylamino. Some preferred formulations additionally contain a secondary solvent. Particularly preferred formulations may contain from about 0.2% to about 75% of a secondary solvent. Particularly useful secondary solvents include glycols and polyhydroxyl compounds described in more detail below. Alternatively, in some embodiments, the stripper solutions are free or essentially free of a secondary solvent.

The preferred formulations have freezing points sufficiently below 25° C. to minimize solidification during transportation and warehousing. More preferred formulations have freezing points below about 15° C., below about 0° C., below about −5° C., below about −7° C., below about −10° C., below about −12° C., below about −15° C., below about −18° C., and/or below about −21° C. Because the preferred stripper solutions remain liquid at low temperatures, the need to liquefy solidified drums of stripper solution received during cold weather or stored in unheated warehouses before the solution can be used is eliminated or minimized. The use of drum heaters to melt solidified stripper solution is time consuming, requires extra handling and can result in incomplete melting and modification of the melted solution's composition.

Additionally, compositions according to the present disclosure display high loading capacities enabling the composition to remove higher levels of photoresists without the precipitation of solids. The loading capacity is defined as the number of $cm^3$ of photoresist or bilayer material that can be removed for each liter of stripper solution before material is re-deposited on the wafer or before residue remains on the wafer. For example, if 20 liters of a stripper solution can remove 300 $cm^3$ of photoresist from the surfaces of the wafer before either redeposition occurs or residue remains on the wafer, the loading capacity is 300 $cm^3$/20 liters=15 $cm^3$/liter The sum of the weight percent of the DMSO and the weight percent of the alkanolamine in the compositions of this invention may be from about 55% to about 97%. In other embodiments, the compositions may contain from about 55% to about 95%, or from about 65% to about 95%, or from about 70% to about 97% or from about 75% to about 95%, or from about 80% to about 97%, or from about 85% to about 97%, or from about 85% to about 95%, or from about 90% to about 97%, or from about 75% to about 90%, or from about 75% to about 85%, or from about 90% to about 95% of DMSO and the alkanolamine. In some embodiments, the weight percent DMSO is greater than the weight percent alkanolamine, and the DMSO may be present in the composition at an amount from 5% to about 30%, or from 10% to about 30%, or from 10% to about 25%, or from 10% to about 20% more than the % alkanolamine present. In other compositions, the weight percent DMSO is less than the weight percent alkanolamine, and the DMSO may be present in the composition at an amount from 5% to about 30%, or from 10% to about 30%, or from 10% to about 25%, or from 10% to about 20%, or from 15% to about 20% less than the % alkanolamine present. Therefore, in some embodiments, the solutions may comprise from about 20% to about 90%, or from about 55% to about 60%, or from about 30% to about 50%, or from about 35% to about 45%, or from about 55% to about 75% DMSO.

The compositions may comprise from about 2% to about 10%, or from 2% to about 8% or from about 2% to about 6%, or from about 2% to about 5%, or from about 2% to about 4%, or from about 2% to about 3%, or from about 1% to about 7%, or from about 1% to about 4% of the quaternary ammonium hydroxide. Preferred quaternary substituents include ($C_1$-08) alkyl, benzyl, arylalkyl, ($C_1$-$C_5$) alcohol, and combinations thereof. Some preferred quaternary ammonium hydroxides are choline-type hydroxides, meaning quaternary ammonium hydroxides having at least one alcohol group attached to the nitrogen, such as choline hydroxide and tri(2-hydroxyethyl)methylammonium hydroxide. Another useful quaternary ammonium hydroxide is dimethyldipropylammonium hydroxide. The preferred quaternary ammonium hydroxides are choline hydroxide and dimethyldipropylammonium hydroxide.

Because some of the stripper solution's components may be provided as aqueous solutions, the composition may additionally contain water. The solutions may contain greater than 1 wt. %, or 2 wt. %, or 3 wt. % water. In other embodiments, the solutions may contain between about 1 wt. % or about 2 wt. % or about 3 wt. % to about 7 wt. % or about 8 wt. % water.

All %'s provided herein are weight percents based on the total weight of the composition.

Suitable levels of the required alkanolamine can range from about 1% or 2% to about 75% of the composition. In some embodiments, the alkanolamine is from about 40% to about 65%, or from about 50% to about 60%, or from about 30% to about 40% or from about 5% to about 40% of the solution.

Suitable alkanolamines have at least two carbon atoms and have the amino and hydroxyl substituents on different carbon atoms. Suitable alkanolamines include, but are not limited to, ethanolamine, N-methylethanolamine, N-ethylethanolamine, N-propylethanolamine, N-butylethanolamine, diethanolamine, triethanolamine, N-methyldiethanolamine, N-ethyldiethanolamine, isopropanolamine, diisopropanolamine, triisopropanolamine, N-methylisopropanolamine, N-ethylisopropanolamine, N-propylisopropanolamine, 2-aminopropane-1-ol, N-methyl-2-aminopropane-1-ol, N-ethyl-2-aminopropane-1-ol, 1-aminopropane-3-ol, N-methyl-1-aminopropane-3-ol, N-ethyl-1-aminopropane-3-ol, 1-aminobutane-2-ol, N-methyl-1-aminobutane-2-ol, N-ethyl-1-aminobutane-2-ol, 2-aminobutane-1-ol, N-methyl-2-aminobutane-1-ol, N-ethyl-2-aminobutane-1-ol, 3-aminobutane-1-ol, N-methyl-3-aminobutane-1-ol, N-ethyl-3-aminobutane-1-ol, 1-aminobutane-4-ol, N-methyl-1-aminobutane-4-ol, N-ethyl-1-aminobutane-4-ol, 1-amino-2-methylpropane-2-ol, 2-amino-2-methylpropane-1-ol, 1-aminopentane-4-ol, 2-amino-4-methylpentane-1-ol, 2-aminohexane-1-ol, 3-aminoheptane-4-ol, 1-aminooctane-2-ol, 5-aminooctane-4-ol, 1-aminopropane-2,3-diol, 2-aminopropane-1,3-diol, tris (oxymethyl)aminomethane, 1,2-diaminopropane-3-ol, 1,3-diaminopropane-2-ol, and 2-(2-aminoethoxy)ethanol.

When used, a secondary solvent may comprise from about 0.2% to about 35%, or from about 0.2% to about 30%, or from about 0.2% to about 25%, or from about 0.2% to about 20%, or from about 0.2% to about 15%, or from about 0.2% to about 12%, or from about 5% to about 12% of the composition. The secondary solvent can include an alcohol, or a polyhydroxyl compound, or a combination of two or more of these.

The secondary solvent alcohols and polyhydroxyl compounds have two or more hydroxyl groups and do not contain ester, amine, or ether groups. The alcohol or polyhydroxyl compounds can be aliphatic, alicyclic, cyclic, or aromatic, but is desirably aliphatic or alicyclic. The alcohol or polyhydroxyl compound can be saturated or unsaturated, and desirably has one or less unsaturated bonds, or no unsaturated bonds. The alcohol and polyhydroxyl compounds desirably do not contain a heteroatom. The alcohol and polyhydroxyl compounds desirably contain only carbon, oxygen, and hydrogen atoms.

As examples of secondary solvent alcohols can be mentioned linear and branched chain and aromatic alcohols. To illustrate an alcohol of the solution can include methanol, ethanol, propanol, isopropyl alcohol, butanol, tert-butyl alcohol, tert-amyl alcohol, 3-methyl-3-pentanol, 1-octanol, 1-decanol, 1-undecanol, 1-dodecanol, 1-tridecanol, 1-tetradecanol, 1-pentadecanol, 1-hexadecanol, 9-hexadecen-1-ol, 1-heptadecanol, 1-octadecanol, 1-nonadecanol, 1-eicosanol, 1-heneicosanol, 1-docosanol, 13-docosen-1-ol, 1-tetracosanol, 1-hexacosanol, 1-heptacosanol, 1-octacosanol, 1-triacontanol, 1-dotriacontanol, 1-tetratriacontanol, cetearyl alcohol, furfurylalcohol, tetrahydrofurfuryl alcohol. In an illustrative example, the solution can include one or more of furfurylalcohol, tetrahydrofurfuryl alcohol, tert-butyl alcohol, or 3-methyl-3-pentanol.

As mentioned above, the secondary solvent can be a polyhydroxyl compound having two or more hydroxyl groups. The polyhydroxyl compound desirably has a molecular weight of no more than 500, or no more than 400, or no more than 350, or no more than 300, or no more than 275, or no more than 250, or no more than 225, or no more than 200, or no more than 175, or no more than 150, or no more than 125, or no more than 100, or no more than 75.

The polyhydroxyl compound as a secondary solvent can include, ethylene glycol; 1,2-propanediol (propylene glycol); 1,3-propanediol, 1,2,3-propanetriol; 1,2-butanediol; 1,3-propanediol; 2,3-butanediol; 1,4-butanediol; 1,2,3-butanetriol; 1,2,4-butanetriol; 1,2-pentanediol; 1,3-pentanediol; 1,4-pentanediol; 2,3-pentanediol; 2,4-pentanediol; 3,4-pentanediol; 1,2,3-pentanetriol; 1,2,4-pentanetriol; 1,2,5-pentanetriol; 1,3,5-pentanetriol; etohexadiol; p-methane-3,8-polyhydroxyl compound; 2-methyl-2,4-pentanediol; 2,2-dimethyl-1,3-propanediol; glycerin; trimethylolpropane; xylitol; arabitol; 1,2- or 1,3-cyclopentanediol; 1,2- or 1,3-cyclohexanediol; 2,3-norbornanediol; 1,8-octanediol; 1,2-cyclohexane-dimethanol; 1,3-cyclohexanedimethanol; 1,4-cyclohexanedimethanol; 2,2,4-trimethyl-1,3-pentanediol; hydroxypivalyl hydroxypivalate; 2-methyl-1,3-propanediol; 2-butyl-2-ethyl-1,3-propanediol; 2-ethyl-2-isobutyl-1,3-propanediol; 1,6-hexanediol; 2,2,4,4-tetramethyl-1,6-hexanediol; 1,10-decanediol; 1,4-benzenedimethanol; hydrogenated bisphenol A; 1,1,1-trimethylol propane; 1,1,1-trimethylolethane; pentaerythritol; erythritol; threitol; dipentaerythritol; sorbitol; and the like, and combinations of 2 or more of the aforementioned polyhydroxyl compounds and polyhydroxyl compound.

In an illustrative example, the solution can include one or more of the secondary polyhydroxyl solvents of ethylene glycol, 1,2-propanediol (propylene glycol), 1,3-propanediol, 1,4-pentanediol, 1,2-butanediol, or 1,3-butanediol.

The compositions can also optionally contain one or more corrosion inhibitors. Suitable corrosion inhibitors include, but are not limited to, aromatic hydroxyl compounds such as catechol and resorcinol; alkylcatechols such as methylcatechol, ethylcatechol and t-butylcatechol, phenols and pyrogallol; aromatic triazoles such as benzotriazole; alkylbenzotriazoles; sugar alcohols such as glycerol and sorbitol; carboxylic acids such as formic acid, acetic acid, propionic acid, butyric acid, isobutyric acid, oxalic acid, malonic acid, succinic acid, glutaric acid, maleic acid, fumaric acid, benzoic acid, phtahlic acid, 1,2,3-benzenetricarboxylic acid, glycolic acid, lactic acid, malic acid, citric acid, acetic anhydride, phthalic anhydride, maleic anhydride, succinic anhydride, salicylic acid, gallic acid, and gallic acid esters such as methyl gallate and propyl gallate; metal salts such as copper (II) nitrate; copper (II) bromide; copper (II) chlorate; copper (II) chloride; copper (II) fluorosilicate; copper (II) formate; copper (II) selenate; copper (II) sulfate; organic salts of carboxyl containing organic containing compounds described above, basic substances such as ethanolamine, trimethylamine, diethylamine and pyridines, such as 2-aminopyridine, and the like, and chelate compounds such as phosphoric acid-based chelate compounds including 1,2-propanediaminetetramethylene phosphonic acid and hydroxyethane phosphonic acid, carboxylic acid-based chelate compounds such as ethylenediaminetetraacetic acid and its sodium and ammonium salts, dihydroxyethylglycine and nitrilotriacetic acid, amine-based chelate compounds such as bipyridine, tetraphenylporphyrin and phenanthroline, and oxime-based chelate compounds such as dimethylglyoxime and diphenylglyoxime. A single corrosion inhibitor may be used or a combination of corrosion inhibitors may be used. Corrosion inhibitors have proven useful at levels ranging from about 1 ppm to about 10%. In an embodiment, the solution may contain about 0.05 weight percent to about 7 weight percent of a first corrosion inhibitor and about 0.001 weight percent to about 3 weight percent of a second corrosion inhibitor. In other embodiments, the solution may contain at least 0.05 weight percent, or at least 0.1 weight percent, or at least 1 weight percent, and/or less than about 3 weight percent, and/or less than about 7 weight percent of the first corrosion inhibitor. In other embodiments, the solution may contain at least 0.001 weight percent, or at least 0.01 weight percent, or at least 0.1 weight percent, and/or less than about 1 weight percent, and/or less than about 2 weight percent, and/or less than about 3 weight percent of the second corrosion inhibitor. The first and second corrosion inhibitors are not the same. Both the first corrosion inhibitor and the second corrosion inhibitor may be selected from the corrosion inhibitors described above. In one embodiment, the one or more corrosion inhibitors may comprise copper (II) nitrate; copper (II) bromide; copper (II) chlorate; copper (II) chloride; copper (II) fluorosilicate; copper (II) formate; copper (II) selenate; and/or copper (II) sulfate alone or in combination with at least one of the corrosion inhibitors above. In an alternative embodiment, the one or more corrosion inhibitors may be copper (II) nitrate, copper (II) bromide; copper (II) chlorate; copper (II) chloride; copper (II) fluorosilicate; copper (II) formate; copper (II) selenate; copper (II) sulfate and/or resorcinol. In another preferred embodiment the corrosion inhibitor may comprise copper (II) nitrate and resorcinol.

The stripping formulations can also contain an optional one ore more surfactants, typically at levels in the range of about 0.01% to about 3% or from about 0.01 to about 1 wt. %. Preferred optional surfactants include fluorosurfactants. One example of a preferred fluorosurfactant is DuPont FSO (fluorinated telomere B monoether with polyethylene glycol (50%), ethylene glycol (25%), 1,4-dioxane (<0.1%), water 25%). Another example of a preferred fluorosurfactant is DuPont, Capstone, FS-10, (30% perfluoroalkylsulfonic acid in water).

Preferred temperatures of at least 50° C. are preferred for contacting the substrate whereas for a majority of applications, temperatures of from about 50° C. to about 75° C. are more preferred. For particular applications where the substrate is either sensitive or longer removal times are required, lower contacting temperatures are appropriate. For example, when reworking substrates, it may be appropriate to maintain the stripper solution at a temperature of at least 20° C. for a longer time to remove the photoresist and avoid damaging to the substrate.

When immersing a substrate, agitation of the composition additionally facilitates photoresist removal. Agitation can be effected by mechanical stirring, circulating, or by bubbling an inert gas through the composition. Upon removal of the desired amount of photoresist, the substrate is removed from contact with the stripper solution and rinsed with water or an alcohol. DI water is a preferred form of water and isopropanol is a preferred alcohol. For substrates having components subject to oxidation, rinsing is preferably done under an inert atmosphere. The preferred stripper solutions according to the present disclosure have improved loading capacities for photoresist materials compared to current commercial products and are able to process a larger number of substrates with a given volume of stripper solution.

The stripper solutions provided in this disclosure can be used to remove polymeric resist materials present in a single layer or certain types of bilayer resists. For example, bilayer resists typically have either a first inorganic layer covered by a second polymeric layer or can have two polymeric layers. Utilizing the methods taught below, a single layer of polymeric resist can be effectively removed from a standard wafer having a single polymer layer. The same methods can also be used to remove a single polymer layer from a wafer having a bilayer composed of a first inorganic layer and a second or outer polymer layer. Finally, two polymer layers can be effectively removed from a wafer having a bilayer composed of two polymeric layers.

This disclosure describes chemical solutions used for removal of thick photoresist, which may be a resist of from about 10 µm to about 200 µm or more, or about 15 µm to 200 µm, or from about 20 µm to about 200 µm in advanced packaging applications for semiconductor devices. In other cases, the chemical solutions may be used to remove photoresist from about 1 µm to about 200 µm or more, or about 2 µm to 200 µm, or from about 3 µm to about 200 µm. In one embodiment, the solutions described contain DMSO, monoethanol amine (MEA), water, quaternary ammonium hydroxide, and at least one corrosion inhibitor. The quaternary ammonium hydroxide and the stripper solutions of this invention are essentially free of TMAH. The quaternary ammonium hydroxide is preferentially either choline hydroxide or dimethyldipropylammonium hydroxide. By essentially free it is meant an amount less than 1 percent, alternately less than 0.1 percent, alternately less than 0.01 percent or less than 0.001 percent. Essentially free of also includes free of which is no TMAH is present. In a further embodiment, the quaternary ammonium hydroxide is free of TMAH. The solutions also optionally contain a surfactant. The solutions may contain greater than 1 or 3 wt. % water. In an embodiment, the solutions may contain between about 1 wt. % or 2 wt. % or 3 wt. % to about 7 wt. % or 8 wt. % water. In another embodiment, a ratio of the amount of water to the amount of quaternary ammonium hydroxide in the solutions is greater than about 1.2, greater than about 1.5, greater than about 1.8, greater than about 2.0, greater than about 2.2, and/or greater than about 2.5. In an alternative embodiment, the ratio of the amount of water to the amount of quaternary ammonium hydroxide in the solutions is from about 1.2 to about 1.5. The solutions may also contain greater than 25 wt. % MEA.

Some embodiments of the compositions of the invention may be essentially free of, alternatively free of (as those terms were defined earlier) one or more than one of the following in any combination: nitrogen containing solvents, bis-choline salts, tri-choline salts, oxoammonium compounds, hydroxylamines and derivatives thereof, methyldiethanolamines, aminoethylethanolamines, glycol ethers, hydrogen peroxide, oxidants, organic acids, inorganic acids, inorganic bases, metal hydroxides, glycols, polyols, NMP, surfactants, metal-containing compounds, sugar alcohols and aromatic hydroxyl compounds, and combinations of any of the them. In other embodiments, the composition will be essentially free of (or free of) sodium, and/or calcium, and/or amino carboxylic acids, and/or alcohols, and/or ethylene diamine, and/or ethylene triamine, and/or thiophenol. In some embodiments, the compositions disclosed herein are formulated to be essentially free or free of at least one of the following chemical compounds: alkyl thiols, and organic silanes. In some embodiments, the compositions disclosed herein are formulated to be essentially free or free of one or more of the following: halide-containing compound, for example it may be essentially free or free of one or more of the following: fluoride-, bromine-, chlorine- or iodine-containing compounds. In other embodiments, the composition may be essentially free or free of sulfonic acid and/or phosphoric acid and/or sulfuric acid and/or nitric acid and/or hydrochloric acid. In other embodiments, the composition may be essentially free or free of sulfates and/or nitrates and/or sulfites and/or nitrites. In other embodiments, the composition may be essentially free or free of: ethyl diamine, sodium-containing compounds and/or calcium-containing compounds and/or manganese-containing compounds or magnesium-containing compounds and/or chromium-containing compounds and/or sulfur-containing compounds and/or silane-containing compounds and/or phosphorus-containing compounds. Some embodiments may be essentially free of or free of surfactants. Some embodiments may be essentially free or free of amphoteric salts, and/or cationic surfactants, and/or anionic surfactants, and/or zwitterionic surfactants, and/or non-ionic surfactants. Some embodiments may be essentially free of or free of imidizoles, and/or anhydrides. Some embodiments may be essentially free of or free of pyrrolidones, and/or acetamides. Some embodiments may be essentially free or free of any amines. Some embodiments may be essentially free of or free of peroxy-compounds, and/or peroxides, and/or persulfates, and/or percarbonates, and acids thereof, and salts thereof. Some embodiments may be essentially free of or free of iodates, and/or perboric acid, and/or borates, and/or percarbonates, and/or peroxyacids, and/or cerium compounds, and/or cyanides, and/or periodic acid and/or ammonium molybdate, and/or ammonia. The components that the compositions of this invention may be free of may be in any combination of components as if all of the combinations were set forth herein.

The composition of the present invention may also include one or more of the following additives: chelating agents, chemical modifiers, dyes, biocides, and other additives. The additive(s) may be added to the extent that they do not adversely affect the performance of the composition, typically in amounts up to a total of about 5 weight % of the composition. In other embodiments the composition will be essentially free of or free of chelating agents, dyes, biocides and/or other additives.

In the Example 1, various stripping compositions were used to remove thick spin-on photoresist from a silicon wafer plated with Cu pillars and Sn/Ag solder caps. Resist removal was performed using an immersion process in a beaker.

For the immersion process, coupon-sized samples of semiconductor wafers were processed in beakers. Beakers were filled with 100 mL of a stripping composition and heated to the target temperature of 70° C. When the stripping composition was at the target temperature, a coupon was placed in a holder in the beaker, and slight agitation was provided by a stir bar. Temperature was maintained at the target temperature of 70° C. throughout the process. After a total processing time of 60 minutes, the coupons were removed from the beaker, rinsed with DI water and IPA, and dried with a stream of air.

For the experiments described below, resist removal was observed and noted accordingly. Resist removal is defined as "clean" if all resist was removed from the wafer coupon surface; as "mostly clean" if at least 95% of the resist, but not all of the resist, was removed from the surface; and "partly clean" if at least about 80% of the resist, but less than 95% of the resist, was removed from the surface.

The follow abbreviations are used in the various compositions listed below: DMSO=dimethyl sulfoxide; MEA=monoethanolamine; MMB=3-methoxy 3-methyl-1-butanol; TMAH=tetramethylammonium hydroxide; PG=propylene glycol; DMDPAH=dimethyldipropylammonium hydroxide; THFA=tetrahydrofurfuryl alcohol; DB=diethylene glycol monobutyl ether; CH=choline hydroxide.

Table 1 lists various inventive and comparative stripping compositions.

Example 1

Table 2 lists stripping compositions that were tested for Example 1 using the immersion process and semiconductor wafers with thick photoresist with plated Cu pillars and Sn/Ag solder caps. The heating temperature and time for all compositions in Table 2 was 70° C. and 60 minutes, respectively.

In the Example 2, various stripping compositions were used to remove 40 µm thick negative dry film photoresist from a silicon wafer plated with Cu features. Resist removal was performed using an immersion process in a beaker.

For the immersion process, coupon-sized samples of semiconductor wafers were processed in beakers. Beakers were filled with 100 mL of a stripping composition and heated to the target temperature of 70° C. When the stripping composition was at the target temperature, a coupon was placed in a holder in the beaker, and slight agitation was provided by a stir bar. Temperature was maintained at the target temperature of 70° C. throughout the process. After a total processing time of 30-60 minutes, the coupons were removed from the beaker, rinsed with DI water and IPA, and dried with a stream of air.

For the experiments described below, resist removal was observed and noted accordingly. Resist removal is defined as "clean" if all resist was removed from the wafer coupon surface; as "mostly clean" if at least 95% of the resist, but not all of the resist, was removed from the surface; and "partly clean" if at least about 80% of the resist, but less than 95% of the resist, was removed from the surface.

Example 2

Table 3 lists stripping compositions that were tested for Example 2 using the immersion process and semiconductor wafers with thick dry film photoresist with plated Cu features. The heating temperature in Table 3 was 70° C.

Example 3

In the Example 3, various stripping compositions were used to evaluate metal corrosion. A metal corrosion test was performed using an immersion process in a beaker.

For the immersion process, coupon-sized samples of semiconductor wafers containing a known thickness layer of Cu and coupon-sized samples of semiconductor wafers containing a known thickness layer of Sn were processed in beakers. The Cu and Sn thickness layers were deposited on the wafers by physical vapor deposition. Beakers were filled with 100 mL of a stripping composition and heated to the target temperature of 70° C. When the stripping composition was at the target temperature, a sample coupon having each metal thereon and having a known surface area was placed in a holder in the beaker, and agitation was provided by a stir bar. Temperature was maintained at the target temperature of 70° C. throughout the process. After a total processing time of 60 or 120 minutes, the coupons were removed from the beakers.

Samples of the solution were collected, and concentrations of dissolved Cu and Sn were measured by inductively coupled plasma atomic emission spectroscopy (ICP-AES). Concentrations of dissolved Cu and Sn were also measured in samples of the solutions taken as controls before the solutions were heated and used to process coupons. The change in the concentration of dissolved Cu or Sn indicated the amount of metal that was dissolved by the formulation during the coupon cleaning process. A small change in dissolved metal concentrations of 0 ppm vs. the control level indicates very good metal compatibility, that is, a low metal etch rate.

Table 4 lists ICP-AES measurements for Example 3 for dissolved Cu and Sn concentrations using the immersion process. The control amounts for Cu and Sn are listed respectively in columns 3 and 4 of Table 4, the measured amounts are listed in the next 4 columns as labeled. Concentrations of 0 ppm vs. the control are preferred with a target of 0 ppm. The heating temperature all compositions in Table 4 was 70° C. and the processing times were 60 minutes and 120 minutes, respectively. The amount of Cu or Sn dissolved by the stripper solutions (removed from the wafer coupon) can be determined by subtracting the control amount from the measured amount. For example, for Formulation 1: 2 ppm (2 ppm minus 0 ppm) of Cu was dissolved by the stripper solution at 70° C. and 60 minutes; and 3.8 ppm (4.3 ppm minus 0.5 ppm) of Sn was dissolved by the stripper solution at 70° C. and 60 minutes.

Table 5 lists the freezing point of various formulations with lower temperatures being preferred for improved storage and transportation capabilities.

Example 4

In the Example 4, tests were performed to evaluate the stability of the quaternary ammonium hydroxides. Stability was tested by heating 100 ml of the formulations in a beaker to a target temperature of 70° C. The target temperature was maintained for 8 hours. Small samples were removed from the beakers at target intervals of 2 hours and tested by acid-base titration.

Table 6 lists the change in wt % base levels measured by acid-base titration at each target interval up to 8 hours. A smaller wt % rate of change per target interval is preferred and indicates a more stable formulation. Improved formulation stability provides the user with a longer product shelf life storage, longer product bath life during use and improved photoresist loading capabilities. The change in wt % base from time 0 through 8 hours is reported in the last row of the table and indicates that Formulation 10 had the smallest change.

TABLE 1

| Formulation 1 | Formulation 2 | Formulation 3 | Comparative Formulation 1 |
|---|---|---|---|
| 38.99% DMSO | 80.89% THFA | 56.99% DMSO | 69.075% DB solvent |
| 55.0% MEA | 6% MEA | 36% MEA | 20% MEA |
| 2.475% CH | 2.62% DMDPAH | 2.6% DMDPAH | 2.475% TMAH |
| 3.025% water | 10.48% PG | 3.9% water | 7.44% water |
| 0.5% sorbitol | 0.01% FS-10 | 0.5% sorbitol | 1% sorbitol |
| 0.01% FS-10 | | 0.01% FS-10 | 0.010% copper (II) nitrate hemi(pentahydrate) |

| Comparative Formulation 2 | Comparative Formulation 3 | Comparative Formulation 4 | Formulation 4 |
|---|---|---|---|
| 54.090% THFA | 54.09% DB solvent | 58.34% DB solvent | 43.99% DMSO |
| 36% MEA | 36% MEA | 36% MEA | 36% MEA |
| 2.475% TMAH | 2.475% TMAH | 2.45% TMAH | 4% DMDPAH |
| 7.425% water | 7.425% water | 2.45% water | 16% PG |
| 0.01% FS-10 | 0.01% FS-10 | 0.01% FS-10 | 0.01% FS-10 |
| | | 0.75% sorbitol | |

| Formulation 5 | Formulation 6 | Formulation 7 |
|---|---|---|
| 53.49% DMSO | 34.49% DMSO | 37.99% DMSO |
| 36% MEA | 55% MEA | 55% MEA |
| 4% DMDPAH | 4% DMDPAH | 2.6% DMDPAH |
| 6% water | 6% water | 3.9% water |
| 0.01% FS-10 | 0.01% FS-10 | 0.01% FS-10 |
| 0.5% sorbitol | 0.5% sorbitol | 0.5% sorbitol |

| Formulation 8 | Comparative Formulation 5 | Comparative Formulation 6 |
|---|---|---|
| 80.865% DMSO | 81.9% DMSO | 59.22% DMSO |
| 6% MEA | 3% MEA | 35.92% MEA |
| 2.62% DMDPAH | 2.55% TMAH | 2.425% TMAH |
| 10.48% PG | 2.55% water | 2.425% water |
| 0.010% copper (II) nitrate hemi(pentahydrate) | 10% MMB | 0.01% FS-10 |
| 0.01% FS-10 | | |

| Formulation 9 | Formulation 10 | Formulation 11 |
|---|---|---|
| 38.475% DMSO | 38.975% DMSO | 39.0% DMSO |
| 55.0% MEA | 55.0% MEA | 55.0% MEA |
| 2.475% CH | 2.475% CH | 2.475% CH |
| 3.04% water | 3.04% water | 3.025% water |
| 1% sorbitol | 0.5% resorcinol | 0.5% resorcinol |
| 0.010% copper (II) nitrate hemi(pentahydrate) | 0.010% copper (II) nitrate hemi(pentahydrate) | |

TABLE 2

| Formulation | Resist removal |
|---|---|
| Formulation 2 | Partly clean |
| Formulation 3 | Partly clean |
| Comparative Formulation 1 | Partly clean |
| Comparative Formulation 2 | Mostly clean |
| Comparative Formulation 3 | Partly clean |
| Comparative Formulation 4 | Partly clean |
| Formulation 4 | Mostly clean |
| Formulation 5 | Mostly clean |
| Formulation 6 | Mostly clean |
| Formulation 7 | Mostly clean |
| Formulation 10 | Clean |

TABLE 3

| Formulation | Process Time | Resist Removal |
|---|---|---|
| Formulation 8 | 60 min | Clean |
| Comparative Formulation 5 | 60 min | Clean |
| Comparative Formulation 6 | 60 min | Clean |
| Formulation 3 | 30 min | Clean |

TABLE 4

| | Control | | 70° C./60 min | | 70° C./120 min | |
|---|---|---|---|---|---|---|
| Formulation | Cu (ppm) | Sn (ppm) | Cu (ppm) | Sn (ppm) | Cu (ppm) | Sn (ppm) |
| Formulation 1 | 0 | 0.5 | 2.0 | 4.3 | 3.3 | 7.4 |
| Formulation 9 | 32.1 | 0.5 | 32 | 0.7 | 33.6 | 0.8 |
| Formulation 10 | 32.2 | 0.5 | 32.2 | 0.6 | 32 | 0.7 |
| Formulation 11 | 0 | 0.5 | 13.7 | 0.8 | 18.7 | 0.8 |

TABLE 5

| Formulation | Freezing point (° C.) |
|---|---|
| Formulation 1 | <−21 |
| Formulation 3 | <−21 |
| Formulation 8 | 8 |
| Formulation 10 | <−21 |
| Comparative Formulation 5 | 10 |

TABLE 6

Measured Weight Percent Base Over Time

| hours @ 70° C. | Formulation 2 | Comparative formulation 5 | Formulation 10 |
|---|---|---|---|
| 0 | 2.45 | 2.59 | 2.51 |
| 2 | 2.31 | 2.40 | 2.43 |
| 4 | 2.13 | 2.13 | 2.36 |
| 6 | 1.97 | 1.98 | 2.26 |
| 8 | 1.88 | 1.71 | 2.16 |
| Change in wt % over 8 hours | 0.57 | 0.88 | 0.35 |

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified. Further, any use of "having", "comprising", "containing" or the like in the specification and in the claims include the more narrow descriptors: "consisting essentially of" and "consisting of" as if they were expressly written in the alternative following "having", "comprising", "containing" or the like. Additionally, the use of the articles "a" or "an" or "the" to describe any of the components of the stripper compositions shall be interpreted anywhere that they appear in the specifications and the claims as if they were replaced with "one or more than one".

What is claimed is:

1. A stripper solution for removing photoresist from substrates comprising:
   about 20 wt. % to about 90 wt. % dimethyl sulfoxide;
   about 1 wt. % to about 7 wt. % of quaternary ammonium hydroxide having at least one alkanol group comprising choline hydroxide;
   about 1 wt. % to about 75 wt. % of alkanolamine;
   about 0.001 wt. % to about 7 wt. % of a first corrosion inhibitor comprising copper (II) nitrate hemi (pentahydrate); and
   about 1 wt. % to about 8 wt. % water;
   wherein the solution exhibits a freezing point below about 0 degrees Celsius; and
   wherein the quaternary ammonium hydroxide is free of tetramethylammonium hydroxide.

2. The solution of claim 1, wherein the quaternary ammonium hydroxide further comprises tri(2-hydroxyethyl)methylammonium hydroxide.

3. The solution of claim 1, wherein the alkanolamine is present in the amount of about 25 wt. % to about 75 wt. %.

4. The solution of claim 3, wherein the alkanolamine includes monoethanolamine.

5. The solution of claim 3, wherein the dimethyl sulfoxide is present in the amount of about 55 wt. % to about 60 wt. %;
   wherein the quaternary ammonium hydroxide is present in the amount of about 1.5 wt. % to about 3.5 wt. %;
   wherein the alkanolamine is present in the amount of about 30 wt. % to about 40 wt. %; and
   wherein the first corrosion inhibitor is present in the amount of about 0.001 wt. % to about 3 wt. %.

6. The solution of claim 5, wherein the alkanolamine includes monoethanolamine.

7. The solution of claim 1, wherein the first corrosion inhibitor is present in an amount between about 0.001 wt. % to about 0.1 wt. %.

8. The solution of claim 1, further comprising about 0.01 wt. % to about 3 wt. % of surfactant.

9. The solution of claim 1, further comprising about 0.001 wt. % to about 3 wt. % of a second corrosion inhibitor wherein the second corrosion inhibitor is different from the first corrosion inhibitor.

10. The solution of claim 9, wherein the second corrosion inhibitor is selected from the group consisting of resorcinol, glycerol, and sorbitol.

11. The solution of claim 10, wherein the dimethyl sulfoxide is present in the amount of about 35 wt. % to about 45 wt. %, the quaternary ammonium hydroxide is present in the amount of about 1.5 wt. % to about 3.5 wt. %, the alkanolamine is present in the amount of about 50 wt. % to about 60 wt. %, the first corrosion inhibitor is present in the amount of about 0.05 wt. % to about 3 wt. %, and, the second corrosion inhibitor is present in the amount of about 0.001 wt. % to about 0.1 wt. %.

12. The solution of claim 11, wherein the alkanolamine includes monoethanolamine.

13. The solution of claim 1, wherein the freezing point is below about −15 degrees Celsius.

14. The solution of claim 1, wherein the freezing point is below about −21 degrees Celsius.

15. A stripper solution for removing photoresist from substrates comprising:
- about 20 wt. % to about 90 wt. % dimethyl sulfoxide;
- about 1 wt. % to about 7 wt. % of quaternary ammonium hydroxide having at least one alkanol group comprising choline hydroxide;
- about 1 wt. % to about 75 wt. % of alkanolamine;
- about 0.001 wt. % to about 7 wt. % of a first corrosion inhibitor comprising copper (II) nitrate hemi (pentahydrate); and
- water;
- wherein a ratio of the amount of the water to the amount of the quaternary ammonium hydroxide is greater than about 1.2;
- wherein the solution exhibits a freezing point below about 0 degrees Celsius; and
- wherein the quaternary ammonium hydroxide is free of tetramethylammonium hydroxide.

16. A method of cleaning resist from a substrate comprising:
- contacting the resist on a substrate with a stripping solution for a time sufficient to remove the desired amount of resist and removing the substrate from the stripping solution wherein the stripping solution comprises:
- about 20 wt. % to about 90 wt. % dimethyl sulfoxide;
- about 1 wt. % to about 7 wt. % of quaternary ammonium hydroxide having at least one alkanol group comprising choline hydroxide;
- about 1 wt. % to about 75 wt. % of alkanolamine;
- about 0.001 wt. % to about 7 wt. % of a first corrosion inhibitor comprising copper (II) nitrate hemi (pentahydrate); and
- about 1 wt. % to about 8 wt. % water;
- wherein the solution exhibits a freezing point below about 0 degrees Celsius; and
- wherein the quaternary ammonium hydroxide is free of tetramethylammonium hydroxide.

* * * * *